(12) United States Patent
Chang et al.

(10) Patent No.: US 6,805,752 B2
(45) Date of Patent: Oct. 19, 2004

(54) METHOD AND APPARATUS FOR REDUCING ACIDIC CONTAMINATION ON A PROCESS WAFER FOLLOWING AN ETCHING PROCESS

(75) Inventors: Chih-Yung Chang, Miaoli (TW); Hsiang-Hsing Liu, Miaoli (TW); Shiou Fieng-Chang Chien, Kaohsiung (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 371 days.

(21) Appl. No.: 09/975,540

(22) Filed: Oct. 10, 2001

(65) Prior Publication Data
US 2003/0066545 A1 Apr. 10, 2003

(51) Int. Cl.[7] .................................................. B08B 7/04
(52) U.S. Cl. .............................. 134/19; 134/1.1; 134/30
(58) Field of Search .............................. 134/19, 902, 1, 134/1.1, 32, 105, 106, 107, 108, 30, 1.3; 156/345.3, 345.37, 345.52; 34/247, 266, 269, 380, 406, 427, 524; 438/906

(56) References Cited

U.S. PATENT DOCUMENTS

| | | | | |
|---|---|---|---|---|
| 5,235,995 A | * | 8/1993 | Bergman et al. | 134/105 |
| 5,282,925 A | * | 2/1994 | Jeng et al. | 216/59 |
| 5,770,263 A | * | 6/1998 | Hawthorne et al. | 427/309 |
| 5,972,161 A | * | 10/1999 | Kim et al. | 156/345.31 |
| 6,073,636 A | * | 6/2000 | Kim et al. | 134/1.3 |
| 6,323,463 B1 | * | 11/2001 | Davis et al. | 219/390 |
| 6,358,859 B1 | * | 3/2002 | Lo et al. | 438/712 |
| 6,410,889 B2 | * | 6/2002 | Davis et al. | 219/390 |

FOREIGN PATENT DOCUMENTS

GB 2313574 A * 12/1997 ............ H01J/37/32

* cited by examiner

Primary Examiner—Alexander Markoff
(74) Attorney, Agent, or Firm—Tung & Associates

(57) ABSTRACT

A method and system for reducing acidic contamination on a process wafer following a plasma etching process including; providing an ambient controlled heating chamber for accepting transfer of a process wafer under controlled ambient conditions; transferring the process wafer to the heating chamber under controlled ambient conditions following plasma etching of the process wafer; providing a heat exchange surface within the heating chamber for mounting the process wafer in heat exchange relationship thereto; mounting the process wafer on a heat exchange surface contained within the heating chamber; and, heating the process wafer to a temperature sufficient to vaporize an acidic residue thereon to form acidic vapors; and, removing the acidic vapors from the heating chamber.

10 Claims, 1 Drawing Sheet

METHOD AND APPARATUS FOR REDUCING ACIDIC CONTAMINATION ON A PROCESS WAFER FOLLOWING AN ETCHING PROCESS

FIELD OF THE INVENTION

This invention generally relates to shallow trench isolation (STI) etching apparatus and methods and more particularly to reducing acid contaminated residue associated therewith.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily or permanently, noise margin degradation, voltage shift and cross-talk.

Shallow trench isolation (STI), is the preferred electrical isolation technique especially for a semiconductor chip with high integration. In general, conventional methods of producing an STI feature include forming a hard mask over the trench layer, patterning a photoresist etching mask over the hard mask, etching the hard mask through the photoresist etching mask to form a patterned hard mask, and thereafter etching the trench layer to form the STI feature. Subsequently, the photoresist etching mask is removed and the STI feature is back-filled with a dielectric material.

Frequently STI features are etched with a sequential process flow, where the mask layers are etched in one chamber and the silicon trench is etched in another chamber. Etching is frequently performed by way of a plasma. Typically, in a plasma etching process an etchant source gas supplied to an etching chamber where the plasma is ignited to generate ions from the etchant source gas. Ions are then accelerated towards the process wafer substrate, frequently by a voltage bias, where they remove material (etch) from the process wafer. Various gas chemistries are used to provide variable etching rates for different etching target materials. Frequently used etchant sources include chloro and fluoro-hydrocarbons in addition to HBr to etch through for example, a silicon layer to form a shallow trench isolation feature. Another etchant chemistry, for etching through silicon, for example, includes a $Cl_2/O_2$/HBr-based chemistry. During and after the etching process halogen species such as chlorine and bromine remain on the target surface where, for example, they are incorporated into the sidewalls and bottoms of etched features as well as into overlying layers of photoresist. Since hydrogen is also present in and around the halogen species, highly corrosive acids may condense and form on the process wafer causing corrosive damage. HBr, for instance, is a highly corrosive acid that is frequently formed on the surface of the process wafer.

FIG. 1 shows a typical process chamber configuration used in STI etching. The typical process chamber, for example, includes several different etching chambers, 10, 12, 14, and 16, in addition to a wafer orientation chamber 18, a cool down chamber 24 and loadlock chambers 20 and 22. The robotic arm transfer mechanism is centrally located at 26. In a typical process in STI etching, as explained, several different etching steps with different etching chemistries may be involved thus having the process wafer transferred by robotic arm 26 between multiple etching chambers, for example 10, 12, 14, and 16. Following etching, the process wafer may be transferred by robotic arm 26 to cool down chamber 24 to cool the process wafer prior to transfer to a loadlock chamber, for example, 20 or 22 where the chamber is pressurized to atmospheric pressure for unloading.

During this process, corrosive acids, such as HBr may condense onto the process wafer surface which also contains for example, loose particles from the etching process. Further, during the pressurization process the particles may become dislodged and adhere to the chamber walls and robotic arm thereby causing corrosive damage to the chamber and robotic arm as well as to the process wafer. As a result, over time, the loadlock chambers accumulate residual corrosive particles which can cause damage to process wafers as they are moved through the loadlock chamber thereby necessitating frequent equipment shutdown for cleaning. Another shortcoming of the prior art procedure and apparatus for STI etching may be potential adverse health consequences to equipment operators from an undesired buildup of such contamination.

There is therefore a need in the semiconductor processing art to develop apparatus and methods whereby the level of acid (e.g., HBr) contaminated particles on process wafers and STI etching apparatus in an STI etching procedure is reduced thereby minimizing damage to both process wafers and STI etching apparatus as well as reducing the potential effect of adverse health consequences.

It is therefore an object of the invention to provide a method and apparatus whereby the level of acid (e.g., HBr) contaminated particles is reduced in an STI etching process while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method and apparatus for reducing acidic contamination on a process wafer following a plasma etching process.

In a first embodiment of the present invention, a method is provided for reducing acidic contamination on a process wafer following a plasma etching process including providing an ambient controlled heating chamber for accepting transfer of a process wafer under controlled ambient conditions; transferring the process wafer to the heating chamber under controlled ambient conditions following plasma etching of the process wafer; providing a heat exchange surface within the heating chamber for mounting the process wafer in heat exchange relationship thereto; mounting the process wafer on a heat exchange surface contained within the heating chamber; and, heating the process wafer to a temperature sufficient to vaporize an acidic residue thereon to form acidic vapors; and, removing the acidic vapors from the heating chamber.

In another embodiment, the step of removing the acidic vapors is carried out simultaneously with the step of heating the process wafer. In another related embodiment, the steps of heating the process wafer and removing the acidic vapor are carried out for a period of time sufficient to remove from about 50 percent to about 100 percent of the acidic residue. In yet another related embodiment, the step of transferring the process wafer to the heating chamber is carried out prior to transferring the process wafer to an unloading chamber for unloading the process wafer.

In yet further related embodiments, the process wafer is heated within a temperature range of about 75° C. to about 100° C. Further, the ambient pressure within the heating chamber is maintained within a range of 10 milliTorr to 500 milliTorr. Yet further, the step of heating the process wafer is carried out for a period of about 30 to about 90 seconds.

In further related embodiments, the heat exchange surface is supplied with a heat exchange fluid. Further, the heat exchange fluid is supplied in fluid communication with a heat exchanger. Yet further, the heat exchanger is provided with means for sensing a fluid flow rate and means for sensing a temperature. Further yet, at least one of the fluid flow rate and the temperature is controllably selected by a computer.

In another related embodiment, the step of transferring the process wafer to the heating chamber is effectuated by a means for remotely manipulating the process wafer under controlled ambient conditions.

In yet another related embodiment, the acidic residue is selected from the group consisting of HBr, HCl and HF.

Another aspect of the present invention provides a heating chamber system for reducing acidic contamination on a process wafer following a plasma etching process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
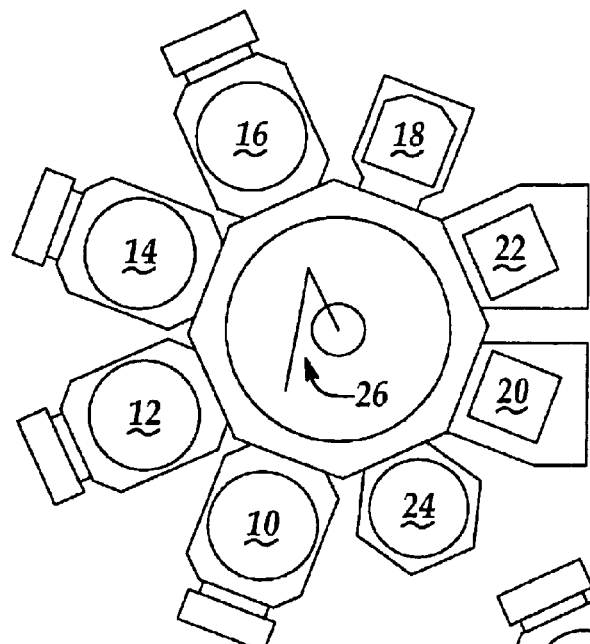
FIG. 1 is a schematic representation of a typical plasma etching system according to the prior art.
Figure 2:
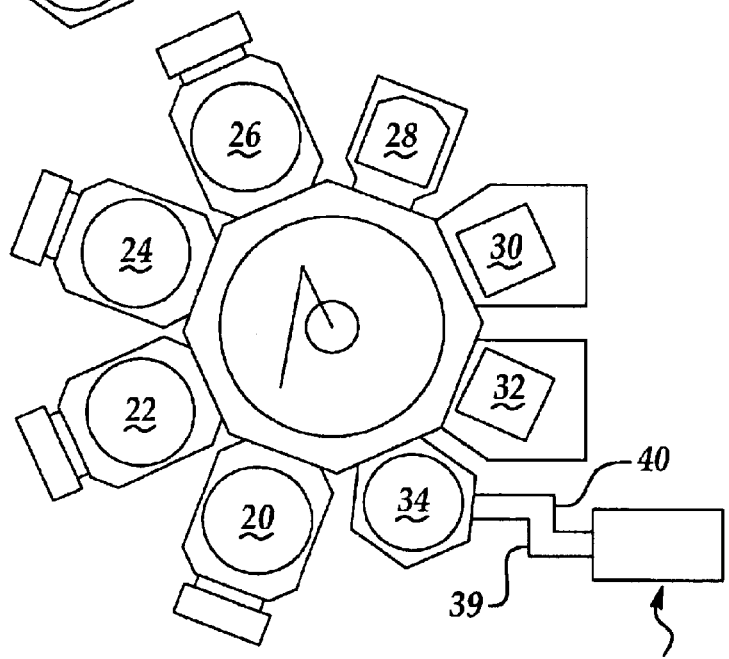
FIG. 2 is a schematic representation of a plasma etching system showing selected features of the present invention.

The method and apparatus according to the present invention is more clearly described by referring to FIG. 2. FIG. 2 is a schematic representation of a multi-chamber processing system for carrying out shallow trench isolation (STI) etching. As previously discussed with reference to. FIG. 1, several modular processing chambers may be attached to the processing system for carrying out different procedures. An exemplary system for example is the Centura 5200 ™ commercially available from Applied Materials, Inc. of Santa Clara, Calif. The multiple chamber system has the capability to transfer a wafer between its chambers without breaking the vacuum and without having to expose the wafer to moisture or other contaminants outside the multiple chamber system. An advantage of the multiple chamber system is that different chambers in the multiple chamber system may be used for different purposes in the entire process. The process may proceed uninterrupted within the multiple chamber system, thereby preventing contamination of wafers that often occurs when transferring wafers between various separate individual chambers (not in a multiple chamber system) for different parts of a process.

For example, referring to FIG. 2, in an STI process several different etching chambers optimized for different etching steps may be used as shown, for example, at 20, 22, 24, and 26, while another chamber, for example 28 may be used for wafer orientation, and other chambers, for example, 30 and 32, used for loading and unloading process wafers. In the method and apparatus according to the present invention, a heating chamber, 34, is added to the multi-chamber system to heat the process wafer prior to transfer by robotic arm 36 to a loadlock chamber e.g., 30 or 32 for unloading. According to the present invention an external heat exchanger 38 is fluid communication by lines 39 and 40 with a heat exchange surface (see FIG. 3) disposed in chamber 34 and in contact with a process wafer for heating the process wafer.

According to the present invention, the heating chamber is used to heat the wafer to a temperature sufficient to vaporize any condensed acidic residue, for example HBr, remaining from the etching process on the wafer surface or on loose particles adhering to the wafer surface. While vaporizing of the acidic residue, a vacuum system is simultaneously used to remove the vaporized gases from the chamber. Suitable pressures may be maintained with a range of 10 mTorr to 500 mTorr. A suitable wafer temperature for vaporizing HBr from the wafer surface has been found to be within a range of about 75° C. to 100° C., although most preferably the wafer temperature is about 80° C. Further, it has been found that the removal of acidic contamination, for example, HBr, by heating the process wafer to about 80° C. can be optimally performed by, for example, by subjecting the process wafer to heating for a period of about 45 to about 75 seconds, most preferably about 60 seconds with removal of about 85% of the acidic contamination. It will be appreciated by the skilled practitioner that the process time may be varied by altering the pumping speed (or pressure) and/or by altering heat transfer characteristics.

According to the present invention, the process wafer is heated by convective and conductive methods preferably by passing a heat transfer fluid through a base plate equipped with a heat exchange manifold with the base plate in contact with the process wafer. Any suitable heat transfer fluid, such as water or a glycol/water mixture may be used. Further, any suitable heat exchange manifold allowing heat transfer may be used, however heat exchange surfaces that optimize heat transfer are preferable and are well known in the art. For example, according to the present invention, a wafer support plate (base plate) used in the cooling chamber of the prior art in as shown in FIG. 1 at 24 may be modified or replaced with a heat exchange system according to the present invention to allow a heat transfer fluid in communication with a heat exchanger to pass heat exchange fluid through the base plate heat exchange manifold to convectively and conductively remove heat from the process wafer.

According to the present invention, the heat exchanger is preferably attached external to the process chamber and may be advantageously equipped with an interlock flow switch to alert the operator should fluid flow be interrupted. Any suitable interlock flow switches, which are well known in the art, may be used. Further, conventional methods of interfacing the heat exchanger for computer control may be advantageously used. For example, the heat exchanger may contain a conventional temperature sensor and a conventional flow rate sensor for adjusting a temperature and a flow rate, respectively. A suitable heat exchanger, for example, is preferably one that may easily maintain a flowing heat exchange fluid temperature according to the present invention within a range of 75° C. to 100° C.

Further, the chamber walls may additionally be fitted with heat exchange conduits, as are well known in the art, for likewise passing a heat exchange fluid also preferably heated to about 80° C. to minimize condensation of the acids (e.g., HBr or HCl) that have been vaporized from the process wafer from re-condensing onto the walls of the heating chamber.

Figure 3:
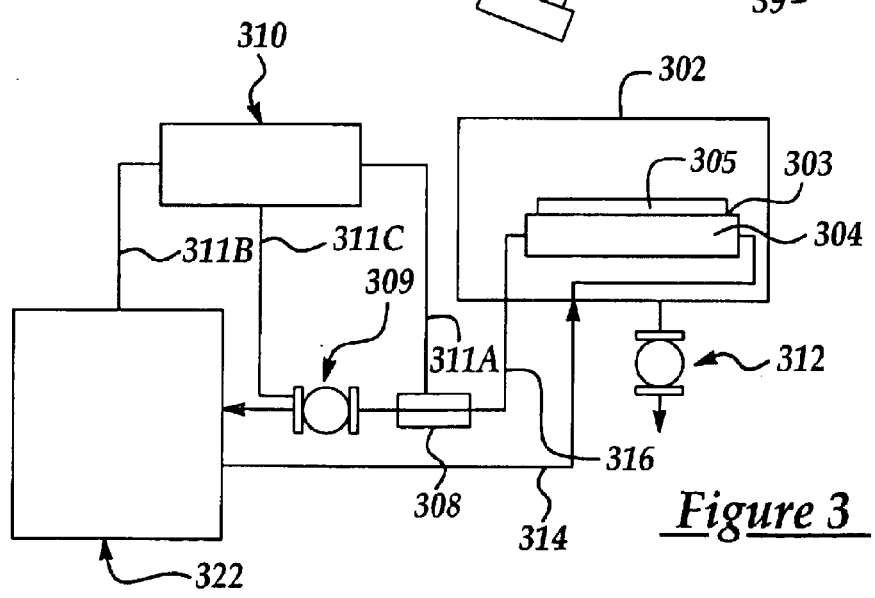
FIG. 3 is a schematic representation of a heating chamber according to the present invention.

Referring to FIG. 3 where the heating chamber is shown in greater detail, in operation, heating chamber 302 houses base plate 304 equipped with a heat exchange manifold (not shown) and a heat exchange surface 303 and the base plate is in fluidic communication with heat exchanger 322 located externally to the chamber 302, the chamber ambient pressure being maintained under vacuum by vacuum pump 312. Heat exchange fluid is supplied by pump 309 from heat exchanger 322 by way of line 314 to base plate 304 equipped internally with a heat exchange manifold (not shown) in contact with heat exchange surface 303 which in turn contacts wafer 308 to convectively and conductively transfer heat between the heat exchange fluid and the process wafer 305, respectively. Following heat transfer to heat exchange fluid the heat exchange fluid passes by line 316 to heat exchanger 322 for heat exchange and fluid temperature control.

Line 316 is equipped with an interlock flow switch 308 which is in electronic communication by conventional wire or wireless means (e.g., cable 311A), with controller 310. Controller 310 may also be in electronic communication with chamber process control functions (not shown) and with heat exchanger 322 (e.g., 311B) and pump 309 (e.g., 311C) for taking desired action upon an interruption in heat exchange fluid flow, adjusting a flow rate for temperature control of the fluid or for adjusting a heat exchange rate. Controller 310 may additionally control the temperature of the heat exchange fluid passing through heat exchanger 322.

According to the present invention it has been found, for example, that HBr concentrations present on a process wafer following an etching process according to the prior art were at levels of 0.3 to 0.5 ppm. In contrast, after using the method and apparatus according to the present invention, HBr concentrations present on a process wafer following an etching process, for example, an STI etching process, were reduced to less than 0.05 ppm. As a result, acidic contamination levels were reduced in the loadlock chambers and wafer processing defects due to corrosive action were likewise reduced thereby increasing overall wafer processing throughput and semiconductor feature (e.g., STI features) quality. Moreover, the corrosive action that the etching system parts have been subjected to by acidic contamination such as the robotic arm and loadlock chamber parts according to the prior art has been reduced according to the present invention.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing acidic contamination on a process wafer and in an unloading chamber following a plasma etching process to reduce acidic residue contamination comprising the steps of:

providing an ambient controlled heating chamber separate from an etching chamber and unloading chamber for accepting transfer of a process wafer under controlled ambient conditions prior to transfer to the unloading chamber;

transferring the process wafer to the heating chamber under controlled ambient conditions following plasma etching of the process wafer;

providing a heat exchange surface comprising a wafer support plate within the heating chamber for heating the process wafer;

heating the process wafer by supplying a heat exchange fluid through the wafer support plate to heat the process wafer to vaporize acidic residue remaining on the process wafer from the plasma etching process to form acidic vapors; and, simultaneously applying a vacuum pressure to the heating chamber to remove the acidic vapors from the heating chamber.

2. The method of claim 1, wherein about 50 percent to about 100 percent of the acidic residue is removed.

3. The method of claim 1, further comprising the step of transferring the process wafer to the unloading chamber for unloading the process wafer.

4. The method of claim 1, wherein the process wafer is heated within a temperature range of about 75 degrees Centigrade to about 100 degrees Centigrade.

5. The method of claim 4, wherein the vacuum pressure comprises about 10 milliTorr to 500 milliTorr.

6. The method of claim 5, wherein the step of heating the process wafer is carried out for a period of about 30 to about 90 seconds.

7. The method of claim 1, wherein the heat exchange fluid is supplied at a selected flow rate and fluid temperature by a heat exchanger.

8. The method of claim 7, wherein at least one of the heat exchange fluid flow rate and the heat exchange fluid temperature is adjusted in response to a sensed fluid flow rate and a sensed fluid temperature.

9. The method of claim 1, wherein the step of transferring the process wafer to the heating chamber is effectuated by a means for remotely manipulating the process wafer under controlled ambient conditions.

10. The method of claim 1, wherein the acidic residue is selected from the group consisting of HBr, HCl and HF.

* * * * *